United States Patent
Sun et al.

(10) Patent No.: US 10,048,340 B2
(45) Date of Patent: Aug. 14, 2018

(54) SYSTEM AND METHOD FOR SUPERFAST CHEMICAL EXCHANGE SATURATION TRANSFER SPECTRAL IMAGING

(71) Applicant: The General Hospital Corporation, Boston, MA (US)

(72) Inventors: Phillip Z. Sun, Woburn, MA (US); Iris Y. Zhou, Malden, MA (US)

(73) Assignee: The General Hospital Corporation, Boston, MA (US)

( * ) Notice: Subject to any disclaimer, the term of this patent is extended or adjusted under 35 U.S.C. 154(b) by 247 days.

(21) Appl. No.: 15/173,599

(22) Filed: Jun. 3, 2016

(65) Prior Publication Data

US 2016/0356870 A1 Dec. 8, 2016

Related U.S. Application Data

(60) Provisional application No. 62/170,573, filed on Jun. 3, 2015.

(51) Int. Cl.
   *G01R 33/483* (2006.01)
   *G01R 33/56* (2006.01)

(52) U.S. Cl.
   CPC ..... *G01R 33/4833* (2013.01); *G01R 33/5605* (2013.01)

(58) Field of Classification Search
   CPC ..... G01R 33/561; G01R 33/56; G01R 33/565
   See application file for complete search history.

(56) References Cited

U.S. PATENT DOCUMENTS

| | | | |
|---|---|---|---|
| 2009/0148021 A1* | 6/2009 | Yui | G01R 33/56308 382/131 |
| 2010/0026297 A1* | 2/2010 | Sun | G01R 33/4828 324/309 |
| 2012/0194188 A1* | 8/2012 | Sun | G01R 33/4838 324/309 |

* cited by examiner

*Primary Examiner* — Giovanni Astacio-Oquendo
*Assistant Examiner* — Alvaro Fortich
(74) *Attorney, Agent, or Firm* — Quarles & Brady LLP

(57) ABSTRACT

A system and method for creating magnetic resonance images are provided. The system applies an RF irradiation during a saturation time period at a reference frequency that saturates a range of selected labile spin species of the subject. The system encodes frequency offsets by applying a gradient G1 at least during the saturation time period. The system applies a plurality of slice selection gradients accompanied by a train of RF pulses during a voxel selection time period and a gradient G3 during an acquisition time period. One or more spin/gradient echo signals having information pertaining to at least one of metabolites and metabolite byproducts is acquired to form a CEST medical imaging data set and the CEST medical imaging data set is reconstructed to form a CEST image of the subject including information about the at least one of metabolites and metabolite byproducts within the subject.

20 Claims, 13 Drawing Sheets
(10 of 13 Drawing Sheet(s) Filed in Color)

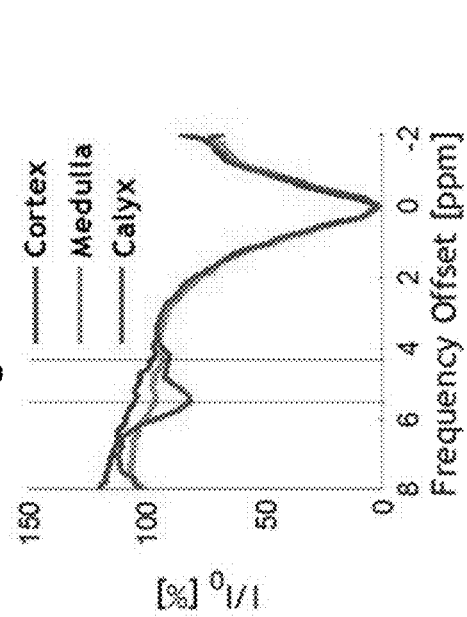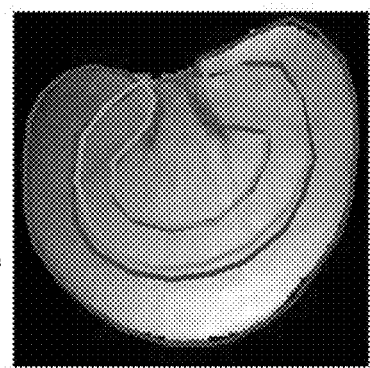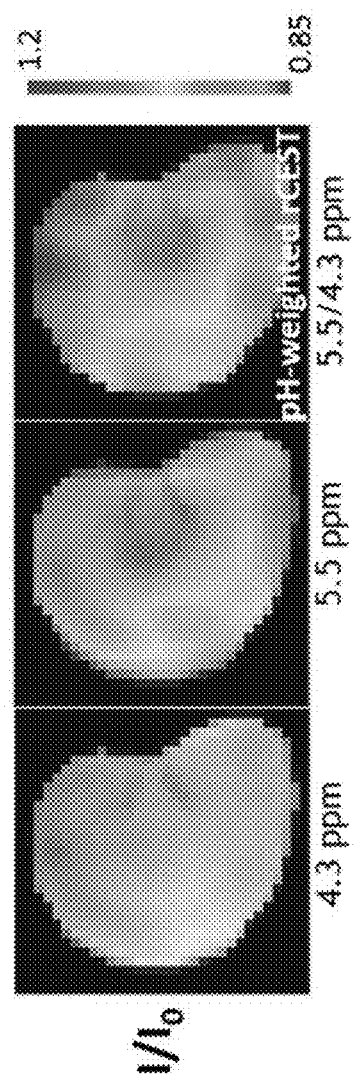

SYSTEM AND METHOD FOR SUPERFAST CHEMICAL EXCHANGE SATURATION TRANSFER SPECTRAL IMAGING

CROSS-REFERENCE TO RELATED APPLICATIONS

This application is based on, claims the benefit of, and incorporates herein by reference in its entirety, U.S. Provisional Application Ser. No. 62/170,573, filed Jun. 3, 2015, and entitled, "Chemical Exchange Saturation Transfer Spectral Imaging."

STATEMENT REGARDING FEDERALLY SPONSORED RESEARCH

This invention was made with government support under grant numbers EB009771 and NS083654 awarded by the National Institutes of Health. The government has certain rights in this invention.

BACKGROUND

The present disclosure relates to magnetic resonance imaging (MRI) methods and systems. More particularly, the disclosure relates to a system and method for chemical exchange saturation transfer MRI having improved sensitivity.

When a substance such as human tissue is subjected to a uniform magnetic field (polarizing field $B_0$), the individual magnetic moments of the excited nuclei in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a roster scan-like pattern sometimes referred to as a "spin-warp", a "Fourier", a "rectilinear", or a "Cartesian" scan. The spin-warp scan technique is discussed in an article entitled "Spin-Warp MR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of MR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of measurement cycles, or "views" that are acquired during the scan to produce a set of k-space MR data from which an entire image can be reconstructed.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Molecular imaging includes a variety of imaging modalities and employs techniques that detect molecular events such as cell signaling, gene expression, and pathologic biomarkers. These techniques seek to achieve early detection of diseases, better management of therapy treatment, and improved monitoring of cancer recurrence. MRI provides specific advantages for molecular imaging applications, due to its noninvasive nature. Traditional molecular MRI techniques rely on the administration of a contrast agent to a designated location within a subject. Oftentimes, a site-specific contrast agent is employed that interacts with a given molecule of interest. These conventional techniques, however, exhibit poor sensitivity, making the detection of the contrast agents difficult. This is especially true when imaging the brain, which has a natural barrier to exogenous chemicals.

Chemical exchange saturation transfer (CEST) serves as a useful tool for molecular MRI. The CEST imaging method offers various advantages over traditional molecular MRI techniques. First, in some cases, the molecules of interest within the subject can be directly detected. This feature mitigates the need for administering contrast agents to the subject. Second, the image contrast mechanism can be controlled with the RF pulses produced by the MRI system and, as such, can be turned on and off when desired. This allows the location of specific molecules of interest to be detected by comparing images having the desired contrast present to those where it has been turned off. Lastly, the CEST imaging method is more sensitive than many traditional molecular MRI techniques, making it able to detect substantially low concentrations of given molecules. However, even with this comparatively improved sensitivity, the magnitude of the endogenous CEST effect is typically small, and it is necessary to enhance the CEST imaging sensitivity for routine use.

CEST imaging renders MRI, which usually detects only bulk water signal, sensitive to metabolites and their byproducts, such as glucose, lactate and glutamate. In particular, the chemical exchange between bulk water and amide protons from endogenous proteins and peptides has been shown to be sensitive to ischemic tissue acidosis, and as a result has given rise to an imaging technique referred to as amide proton transfer (APT) imaging. Since tissue pH decreases in response to abnormal glucose/oxygen metabolism during acute ischemia, pH-sensitive APT imaging may serve as a surrogate metabolic imaging marker for stroke. In that it complements perfusion and diffusion MRI, APT imaging may allow better characterization of penumbra for predicting ischemic tissue outcome in acute stroke. Moreover, APT imaging may eventually help guide thromobolytic and/or neuroprotective therapies for acute stroke.

Traditionally, CEST and APT imaging techniques are limited to acquiring single slice of image data. In response to this challenge, multi-slice CEST techniques have been developed, such as described in U.S. Pat. No. 8,278,925, entitled, "Method for relaxation-compensated fast multi-slice chemical exchange saturation transfer MRI," which is incorporated herein by reference in its entirety.

Further, conventional CEST imaging generally acquires image data by applying pre-saturation pulse at each frequency offset of interest. In CEST imaging, the Z-spectrum or CEST spectrum is characterized by the symmetric direct saturation (DS) around the water frequency, which has led to assignment of 0 ppm to the water frequency. In order to acquire Z-spectrum, the saturation offset needs to be varied from scan to scan, which is time consuming. Therefore, conventional CEST scans often sample pre-determined offsets, potentially missing tremendous amount of diagnostic information.

Therefore, CEST continues to develop as an important imaging technique in MRI, however, it would be desirable to have systems and methods that are more efficient and robust than traditional CEST-based imaging techniques.

SUMMARY

The present disclosure overcomes the aforementioned drawbacks by providing a system and method for fast CEST spectral imaging. In particular, the present disclosure combines superfast Z spectroscopy with chemical shift imaging (CSI) like readout, and developed Superfast CEST spectral imaging (SCSI). SCSI obtains fast Z-spectral CEST information with spatial resolution. While conventional CSI measures dilute metabolites, SCSI harnesses the sensitivity enhancement of CEST mechanism to investigate the interaction between metabolites and tissue water, providing sensitivity enhanced measurements of metabolites and pH among others.

In accordance with one aspect of the disclosure, a magnetic resonance imaging (MRI) system is disclosed that includes a magnet system configured to generate a polarizing magnetic field about at least a region of interest (ROI) in a subject arranged in the MRI system, a plurality of gradient coils configured to apply a gradient field to the polarizing magnetic field, a radio frequency (RF) system configured to apply an excitation field to the subject and acquire MR image data from a ROI, and a computer system. The computer system is programmed to control the RF system to apply a saturation radiofrequency (RF) irradiation during a saturation time period at a reference frequency and saturates a range of frequency offset that covers selected labile spin species of the subject. The computer system is programmed to control the plurality of gradient coils to encode frequency offsets by applying a gradient G1, along slice direction or another preset direction, at least during the saturation time period. The computer system is programmed to control the plurality of gradient coils to apply a plurality of slice selection gradients and RF coils to generate a series of RF pulses during a voxel selection time period. The computer system is programmed to apply a padding gradient G2 for formation of spin echo, and its magnitude and polarity can be adjusted depending on echo center time, and the application of G2, before or after refocusing pulses. The computer system is programmed to control the plurality of gradient coils apply a gradient G3 during an acquisition time period. The computer system is also programmed to control the RF system and the plurality of gradient coils, during the acquisition time period, to acquire one or more spin echo signals having information pertaining to at least one of metabolites and metabolite byproducts within the ROI to form a chemical exchange saturation transfer (CEST) medical imaging data set. The computer system is programmed to reconstruct the CEST medical imaging data set to form a CEST image of the subject including information about the at least one of metabolites and metabolite byproducts or local microenvironment properties such as pH within the subject.

In accordance with another aspect of the disclosure, a method for producing an image of a subject with a magnetic resonance imaging (MRI) system is disclosed that includes at least the following steps. First the MRI system applies a saturation radiofrequency (RF) irradiation during a saturation time period at a reference frequency that saturates a selected labile spin species of a subject. Second, the computer system is programmed to control the plurality of gradient coils to encode frequency offsets by applying a gradient G1, along slice direction or another preset direction, at least during the saturation time period. The MRI system applies a plurality of slice selection gradients accompanied by a series of RF pulses during a region selection time period. The MRI system applies a padding gradient G2. The MRI system applies a gradient G3 during an acquisition time period. The MRI system acquires one or more spin echo signals having information pertaining to at least one of metabolites and metabolite byproducts within the ROI to form a chemical exchange saturation transfer (CEST) medical imaging data set during the acquisition time period. The MRI system further reconstructs the CEST medical imaging data set to form a CEST image of the subject including information about the at least one of metabolites and metabolite byproducts within the subject.

In accordance with yet another aspect of the disclosure, a method for producing a report regarding a subject using a magnetic resonance imaging (MRI) system is disclosed that includes applying a saturation radiofrequency (RF) irradiation during a saturation time period at a reference frequency that saturates a selected labile spin species of a subject. The MRI system encodes frequency offsets by applying a gradient G1, along slice selection or another preset direction, at least during the saturation time period. The method also includes acquiring, with the MRI system, one or more spin echo signals having information pertaining to at least one of metabolites and metabolite byproducts within the ROI to form a chemical exchange saturation transfer (CEST) data set without applying phase encoding gradient or readout gradient, and generating a spectroscopic imaging report from the CEST data set including information about the at least one of metabolites and metabolite byproducts within the subject.

The foregoing and other advantages of the disclosure will appear from the following description.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 3b is an example flow chart setting forth additional steps of the method of FIG. 3a.

FIG. 5c illustrates reference spectrum ($I_0$, blue line) and Z spectra (I) at different saturation levels corresponding to the voxel illustrated in FIG. 5a.

FIG. 5e illustrates normalized Z spectra calculated as $I/I_0$ corresponding to the voxel illustrated in FIG. 5a.

FIG. 9e illustrates Z spectrum from the ROI in the left phantom along with the asymmetric magnetization transfer ratio, where the two vertical lines indicate the peak locations of Creatine at 2 ppm and Nicotinamide at 3.5 ppm.

FIG. 9f illustrates Z spectrum from the ROI in the right phantom along with the asymmetric magnetization transfer ratio, where the two vertical lines indicate the peak locations of Creatine at 2 ppm and Nicotinamide at 3.5 ppm.

FIG. 12a shows in vivo renal image including SCSI Z spectra from a SCSI data from a representative animal after iopamidol injection.

FIG. 12b shows CEST maps at 4.3 ppm and 5.5 ppm and corresponding pH-weighted map calculated from ratiometric analysis by taking the amplitude ratio of 5.5 and 4.3 ppm.

FIG. 12c shows Z spectrum ratio ($I/I_0$) from cortex (blue), medulla (green) and calyx (red) from a representative animal after iopamidol injection.

DETAILED DESCRIPTION

Figure 1:
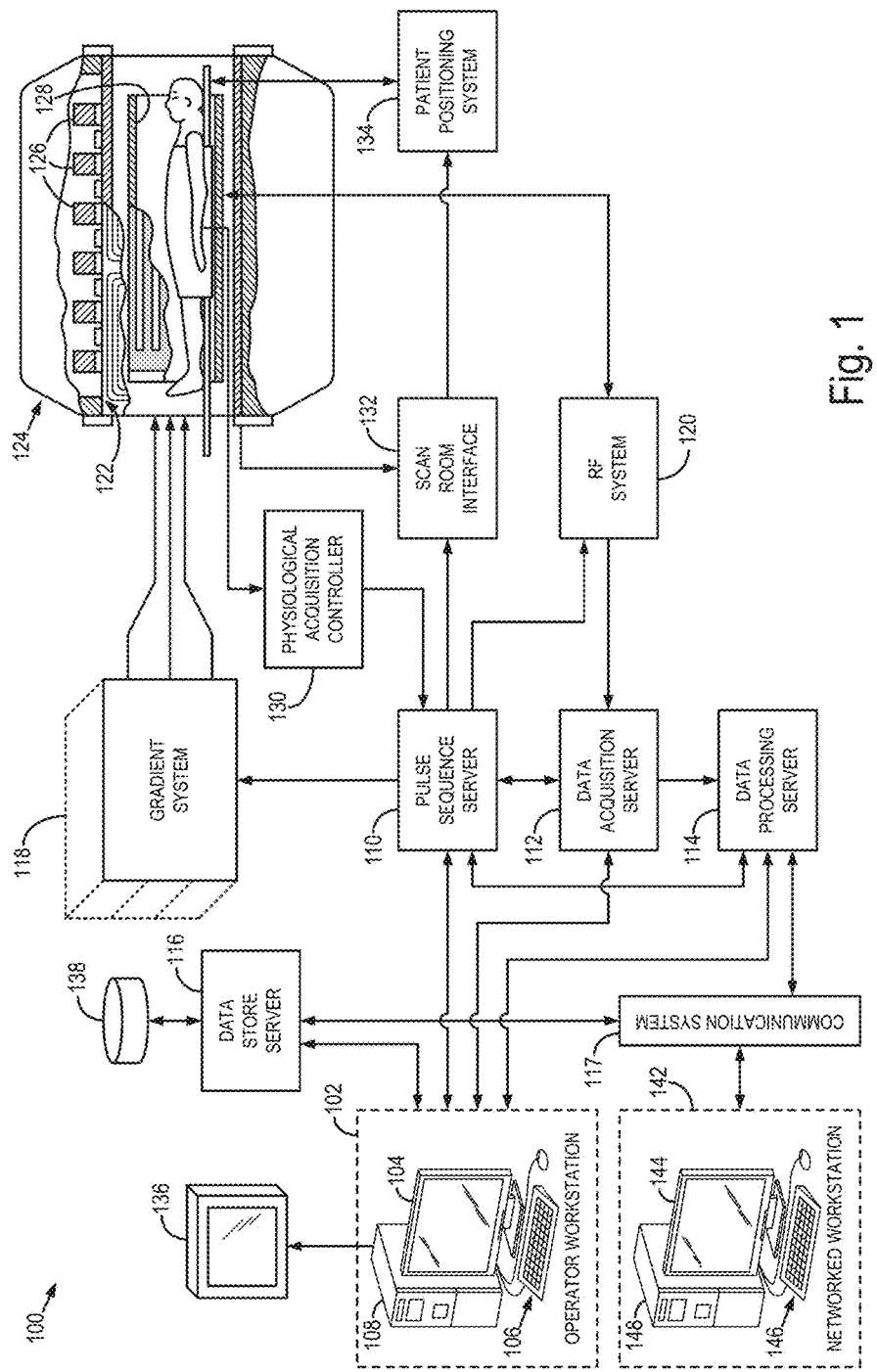
FIG. 1 is a block diagram of an MRI system which employs the present disclosure.

Referring particularly now to FIG. 1, an example of a magnetic resonance imaging (MRI) system 100 is illustrated. The MRI system 100 includes an operator workstation 102, which will typically include a display 104, one or more input devices 106, such as a keyboard and mouse, and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to four servers: a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 117, which may include any suitable network connection, whether wired, wireless, or a combination of both. As an example, the communication system 117 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil (not shown in FIG. 1), are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays (not shown in FIG. 1).

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2}$$ Eqn. 1;

and the phase of the received magnetic resonance signal may also be determined according to the following relationship:

$$\varphi = \tan^{-1}\left(\frac{Q}{I}\right).$$ Eqn. 2

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than passing the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 114 are conveyed back to the operator workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144; one or more input devices 146, such as a keyboard and mouse; and a processor 148. The networked workstation 142 may be located within the same facility as the operator workstation 102, or in a different facility, such as a different healthcare institution or clinic.

The networked workstation 142, whether within the same facility or in a different facility as the operator workstation 102, may gain remote access to the data processing server 114 or data store server 116 via the communication system 117. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

As described above, chemical exchange saturation transfer (CEST) imaging is an emerging MRI contrast mechanism that is sensitive to dilute biomolecules, local pH and temperature, and remains promising for in vivo applications.

For diamagnetic CEST (DIACEST) agents undergoing slow and intermediate chemical exchange, the CEST effect approaches its steady state exponentially. Hence, the conventional CEST MRI pulse sequence includes long RF irradiation followed by fast image readout. Further, conventional CEST imaging generally acquires image data by applying pre-saturation pulse at each frequency offset of interest to obtain Z-spectrum or CEST spectrum to resolve metabolites at different frequency offsets. In order to acquire Z-spectrum, the saturation offset needs to be varied from scan to scan, which is time consuming. As will be described, the present disclosure provides a fast Z-spectral imaging sequence SCSI, which may be combined with multi-echo CEST (meCEST) MRI pulse sequence to utilize the significant residual MR signals after the first echo acquisition. The new sequence SCSI overcomes the limitations of conventional CSI, CEST as well as prior work of fast CEST Z spectroscopy.

Figure 2:
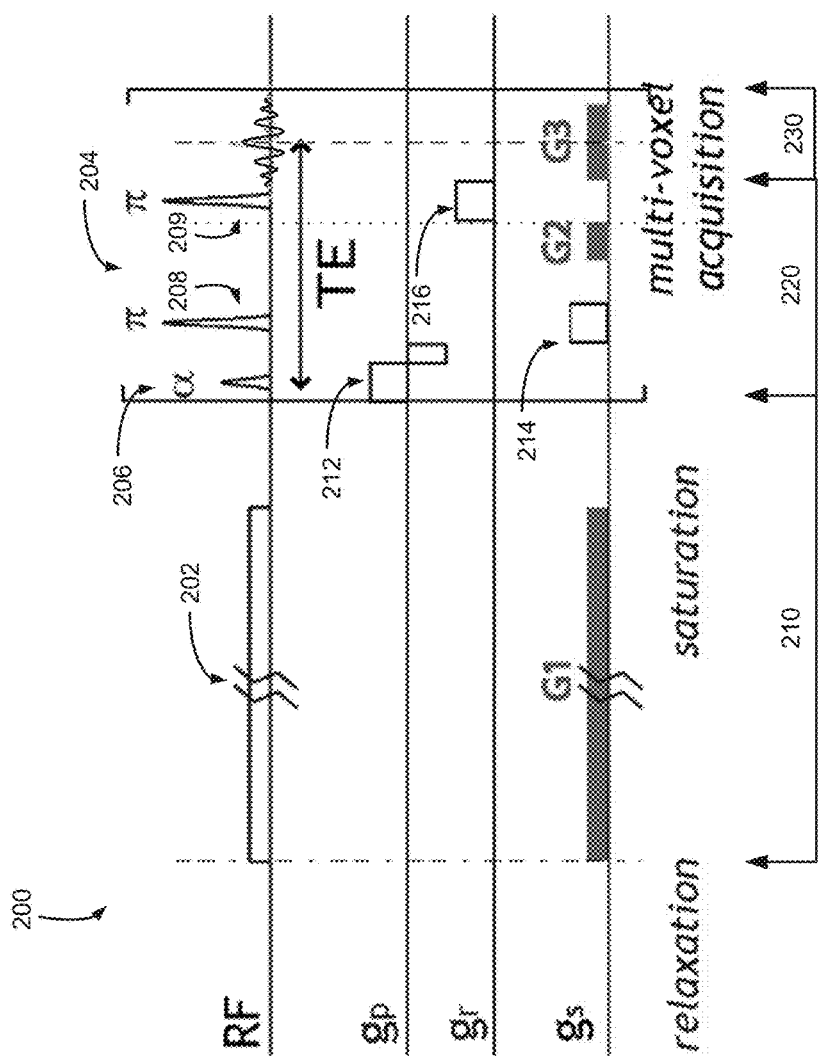
FIG. 2 is a graphic illustration of one pulse sequence for directing the MRI system of FIG. 1 to acquire spectral data in accordance with the present disclosure.

An example of a SCSI pulse sequence 200 in accordance with the present disclosure is illustrated in FIG. 2. The present disclosure may be configured within the context of a single-shot, single-slice EPI pulse sequence, such as illustrated. This can also be combined with variants of EPI sequences, including multi-shot, multi-slice, spiral EPI, and the like. Variations thereon, such as shared k-space (keyhole/TRICKS-type) techniques, acquisitions designed to be utilized with compressed sensing-based techniques, and the like may also be used. Notably, such techniques may be advantageously used when the signal based on the CEST effect is "recycled" using meCEST, which allows the advantageous combination of the speed of, for example, compressed sensing-based techniques with CEST imaging. Specifically, the pulse sequence 200 includes a continuous-wave RF irradiation pulse 202, followed by a plurality of RF pulses 204. For example, the plurality of RF pulses 204 may include a 90° pulse 206 and two 180° pulses 208, 209.

In FIG. 2, the MRI system applies the radiofrequency (RF) irradiation 202 during a saturation time period 210 at a characteristic frequency to saturate magnetization of a range of selected labile spin species such as amide, amine and hydroxyl groups of the subject. The MRI system also encodes frequency range/offset by applying a gradient G1 along the slice selection direction or another direction defined by concurrently applying G1x, G1y and G1z, at least during the saturation time period 210. The combined G1 and RF irradiation determines the range and center of RF saturation. This gradient G1 does not have to be along the slice selection direction but can be any preset arbitrary direction in which the metabolic composition is homogeneous so the saturation offsets can be encoded by G1. After the saturation time period 210 concludes, the MRI system applies three slice-selective RF pulses 204 in orthogonal planes (90°-90°-180°) accompanied by gradients to achieve volume selection, or in some cases with volume limitation using 2D selection. These pulses determine three orthogonal planes whose intersection corresponds to the volume studied. Specifically, the MRI system applies gradient 212 on $g_p$ when applying the RF pulse 206 with a flip angle α. The MRI system applies a gradient 214 on $g_s$ while applying the first 180° RF pulse 208. After that, the MRI system applies a brief padding gradient G2 before applying the second 180° RF pulse 209. The MRI system applies a third gradient G3 on $g_s$, or any preset direction, during an acquisition time period 230 after applying the second 180° RF pulse 209.

The MRI system may select one or more voxels by applying a Point-RESolved Spectroscopy (PRESS) pulse sequence during a voxel selection time period 220 as described above. Alternatively, the MRI system may select one or more voxels by applying a STimulated Echo Acquisition Mode (STEAM) pulse sequence.

Figure 3A:
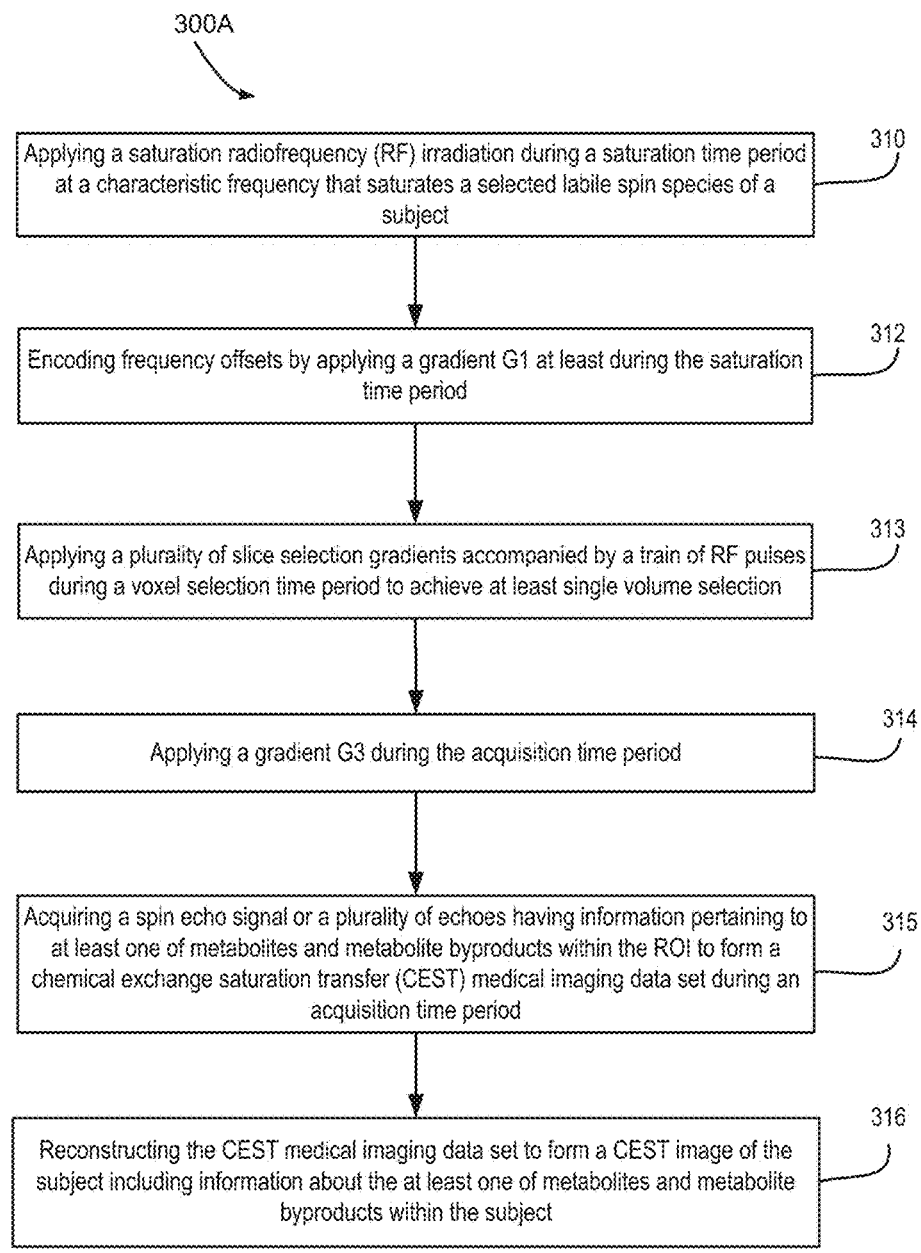
FIG. 3a is an example flow chart setting forth the steps of a method in accordance with the present disclosure.

FIG. 3a is an example flow chart setting forth the steps of a method 300A in accordance with the present disclosure. In step 310, a radiofrequency (RF) irradiation is applied during a saturation time period at a characteristic frequency or a range of frequency offsets that saturates the magnetization of a selected labile spin species of a subject. In step 312, the MRI system encodes saturation frequency range/offset by applying a gradient G1 (as shown in FIG. 2) at least during the saturation time period. After the saturation time period concludes, the MRI system applies a plurality of slice selection gradients accompanied by a train of RF pulses during a voxel selection time period to achieve at least single volume selection in step 313. In step 314, the MRI system applies a gradient G3 during the acquisition time period. In step 315, the MRI system acquires a spin echo signal having information pertaining to at least one of metabolites and metabolite byproducts within the ROI to form a chemical exchange saturation transfer (CEST) medical imaging data set during an acquisition time period. Both gradient echo and spin echo readout can be implemented. Spin echo acquisition allows us to further extend the acquisition to multi-echo readout (m echoes) for even higher SNR by repeating the module after the vertical dotted line or simply the part after the third 180° RF pulse in FIG. 2. The ROI may include a voxel of interest that includes one of the following: brain, breast, muscle, prostate, kidney, placenta, bladder and heart, etc. In step 316, the MRI system reconstructs the CEST medical imaging data set to form a CEST image of the subject including information about the at least one of metabolites and metabolite byproducts within the subject. Here, the MRI system may further control the plurality of gradient coils to apply phase/frequency spatial encoding if needed.

Figure 3B:
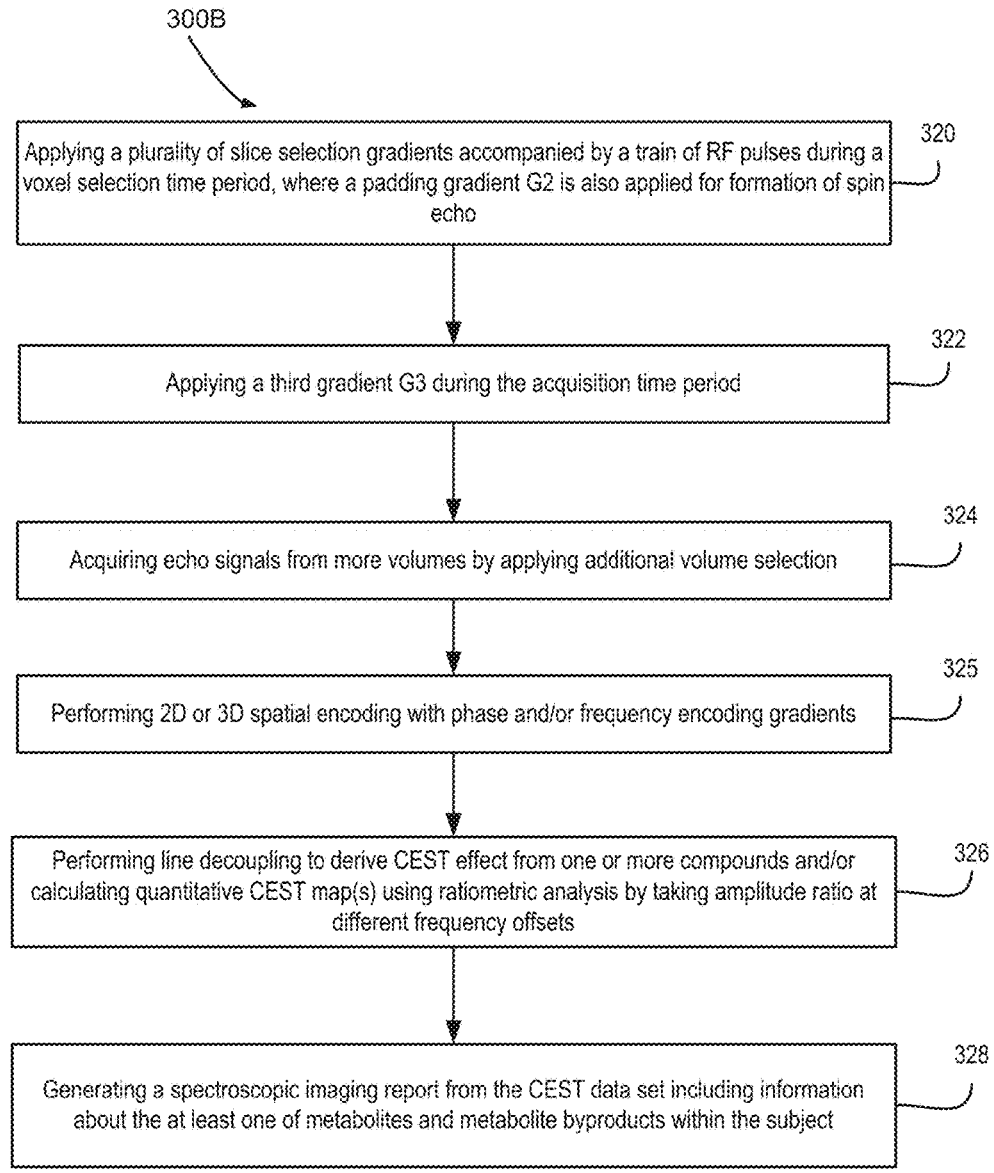

FIG. 3b is an example flow chart setting forth additional steps 300B of the method of FIG. 3a. The method 300A may include one or more of the additional steps 300B. Note that the sequence of the steps in FIG. 3a and FIG. 3b may be changed if needed. In step 320, the MRI system applies a padding gradient G2 during a voxel selection time period (as shown in FIG. 2). In step 322, the MRI system applies a gradient G3 (as shown in FIG. 2) during the acquisition time period. G3 during data readout can be the same as G1 during CEST saturation or different. Similarly, the padding gradient G2 is applied for formation of spin echo, and its magnitude and polarity can be adjusted depending on echo center time, and the application of G2, before or after refocusing pulses. The magnitude of G2 with respect to G3 can be adjusted based on gradient echo or spin echo readout, and its echo time. The polarity of G2 may be determined by its timing with respect to pi pulse to ensure signal formation during G3. In step 324, the MRI system achieves multi-voxel acquisition by repeating the module in brackets during time period 220 and 230 with varied gradients and RF offsets to select volumes at different locations. In step 325 the MRI system performs 2D or 3D spatial encoding with phase and/or frequency encoding gradients.

In step 326, the MRI system calculates pH-weighted map using ratiometric analysis by taking amplitude ration at different frequency offsets. For example, the MRI system may calculate quantitative CEST (i.e. pH or compound concentration) map using ratiometric analysis by taking amplitude ratio at different frequency offsets. Alternatively or additionally, the MRI system may perform line decoupling to derive the CEST effect from one or more compounds so that the contribution is estimated from each metabolite/pool. Further, the MRI system can use ratiometric analysis by taking amplitude ratio at different frequency offsets and further calculate contribution from one or more compounds. Note that Line decoupling is used to resolve contributions from multiple metabolites from CEST Z-spectrum.

In step 328, the MRI system generates a spectroscopy report from the CEST data set including information about the at least one of metabolites and metabolite byproducts within the subject. For example, the MRI system may generates a spectroscopic imaging report from the CEST data set.

Figure 4:
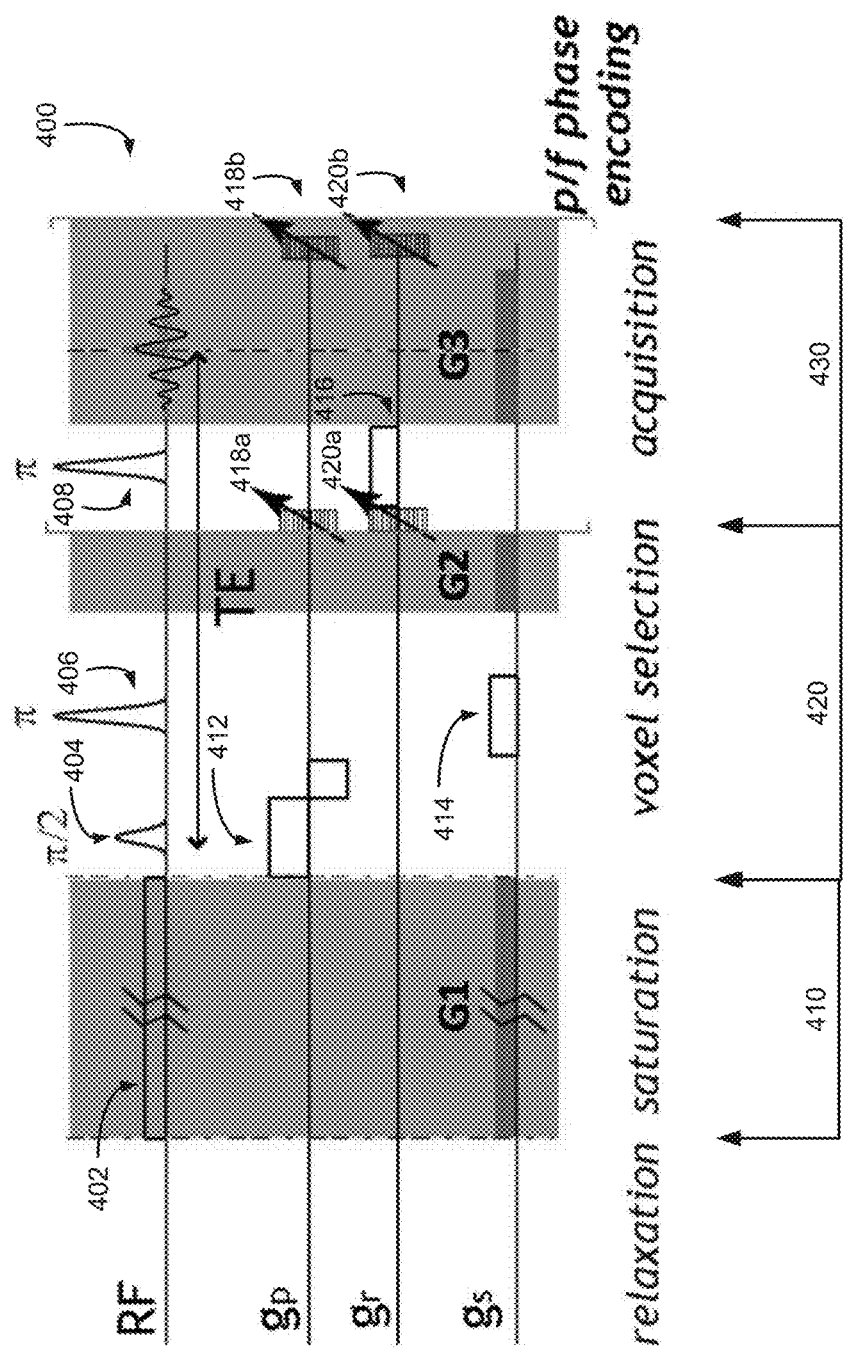
FIG. 4 is a graphic illustration of a modified pulse sequence for directing the MRI system of FIG. 1 to acquire in vivo imaging data in accordance with the present disclosure.

By way of example, FIG. 4 provides a pulse sequence diagram modified with respect to FIG. 2 to perform in vivo SCSI MRI on, for example, rat kidneys. The pulse sequence 400 includes applying an RF saturation pulse 402 during the saturation time period 410 while applying a gradient G1 along the slice selection direction $g_s$. Note this gradient G1 does not have to be along the slice selection direction but can be any preset arbitrary direction in which the metabolic composition is homogeneous so the saturation offsets can be encoded by G1. After applying the saturation pulse 402, the MRI system may apply a plurality of RF pulses including a 90° pulse 404 and two 180° pulses 406, 408. The 90° pulse 404 and the first 180° pulse 406 are applied during the voxel selection time period 420. The second 180° pulse 408 followed by the gradient G3 is applied during the data acquisition period 430, which can be repeated to generate multiple echo signals or for phase encoding steps to further accelerate the acquisition.

After the saturation time period 410 concludes, the MRI system applies the plurality of RF pulses 404, 406, 408 and applies encoding 412 gradient on $g_p$ when applying the RF pulse 404 with a 90° flip angle. The MRI system applies a gradient 414 on $g_s$ while applying the first 180° RF pulse 406. After that, the MRI system applies a padding gradient G2 before applying the second 180° RF pulse 408. The MRI system applies a third gradient G3 during an acquisition time period 430 after applying the second 180° RF pulse 408.

Compared to the sequence 200 in FIG. 2, the pulse sequence 400 includes an additional pair of phase encoding gradients 418a and 420a applied on $g_p$ and $g_r$ respectively during the data acquisition period 430. The signal is then recorded with gradient G3 on, acquiring CEST Z spectroscopic signal with the spatial information. Optionally, the pulse sequence 400 can include additional pair of phase encoding gradients 418b and 420b applied on $g_p$ and $g_r$ respectively data acquisition period 430 for phase encoding steps to further accelerate the acquisition. With this data, localized CEST spectra can be reconstructed over the entire slice or volume. While conventional CSI measures dilute metabolites, the disclosed SCSI exploits CEST mechanism to investigate the interaction between metabolites/contrast agents and tissue water, providing sensitivity enhanced characterizations of metabolites and pH, and the like.

SCSI data may be acquired without ($B_1$=0 µT) or with ($B_1$=1.0 µT) RF saturation. Tests using the above-described pulse sequence, for example, used a slice thickness of 10 mm, a field of view of 40×40 mm, an image matrix of 32×32, and 128 spectral points over ±5 ppm. Exemplary repetition time (TR) and saturation time (TS) of 5 seconds and 2.5 seconds, respectively, were used in testing. In this example, CEST experiments were repeated with the number of signal average (NSA) being 2 or more.

The MRI system may acquire one or more spin echo signals.

Figure 5A:
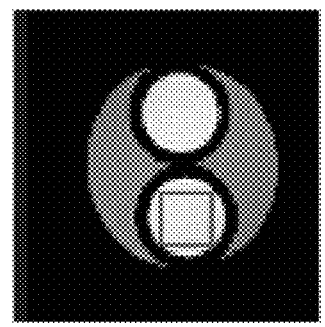
FIG. 5a is a phantom image that includes a single voxel in the left phantom.
Figure 5B:
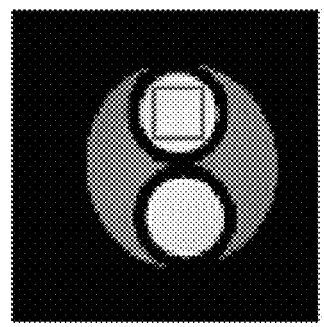
FIG. 5b is a phantom image that includes a single voxel in the right phantom.
Figure 5C:
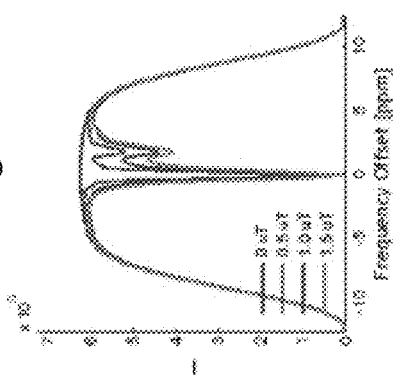
Figure 5D:
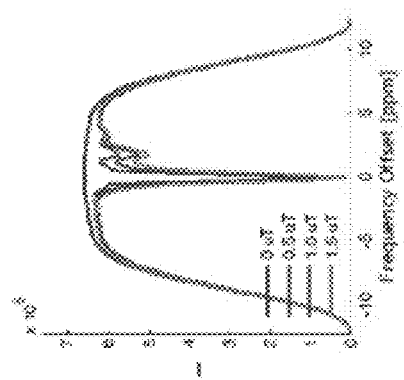
FIG. 5d illustrates reference spectrum ($I_0$, blue line) and Z spectra (I) at different saturation levels corresponding to the voxel illustrated in FIG. 5b.
Figure 5E:
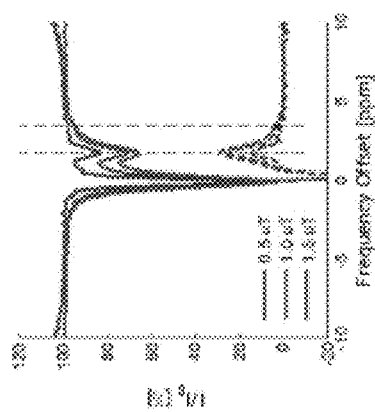
Figure 5F:
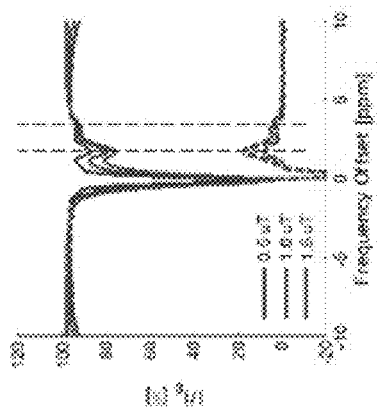
FIG. 5f illustrates normalized Z spectra calculated as $I/I_0$ corresponding to the voxel illustrated in FIG. 5b.

The SCSI sequence in FIG. 2 may be performed on a CEST phantom that includes two vials of $CuSO_4$ doped creatine/nicotinamide solution (50 mM creatine and 100 mM nicotinamide left vial, 100 mM creatine and 50 mM nicotinamide right vial), fixed in a 50 ml falcon tube with 1.5% gel. FIG. 5a shows the phantom image that includes a single voxel in the left phantom. FIG. 5b shows the phantom image that includes a single voxel in the right phantom. FIG. 5c illustrates reference spectrum at different saturation levels corresponding to FIG. 5a. FIG. 5d illustrates reference spectrum at different saturation levels corresponding to FIG. 5b. FIG. 5e illustrates Z spectrums corresponding to FIG. 5a. FIG. 5f illustrates Z spectrums corresponding to FIG. 5b.

Here, single-voxel fast Z-spectral imaging reveals multiple peaks corresponding to different exchangeable proton groups (creatine at 1.9 ppm and nicotinamide at 3.5 ppm) and their concentrations in FIGS. 5c-5f. Spin echo acquisition allows us to further extend superfast CEST Z-spectral imaging to multi-echo readout (m echoes) for even higher SNR, as illustrated in Sensitivity-enhanced multi-echo chemical exchange saturation transfer (meCEST) MRI in U.S. application Ser. No. 14/652,904, which is incorporated herein by reference in its entirety.

Further, as described in U.S. Pat. No. 8,278,925, which is incorporated herein by reference in its entirety, CEST effect can be calculated as CEST ratio (CESTR), following the asymmetry analysis CESTR=($I_{ref}$-$I_{label}$)/$I_0$, where $I_{label}$ and $I_{ref}$ are label and reference images with RF irradiation applied at labile proton frequency ($\Delta\omega_s$) and reference frequency (-$\Delta\omega_s$), and $I_0$ is the control image. In addition, the pH-sensitive CNR may be calculated as:

$$\frac{\Delta CESTR}{\sqrt{(\sigma^2_{pH=6.5}+\sigma^2_{pH=6.0})/2}}; \qquad \text{Eqn. 4}$$

where ΔCESTR is the CESTR difference between two pH compartments, and σ is CESTR standard deviation of each pH compartment. The two pH values in the above equation may be generalized to different parameters to calculate alternative CEST CNR, such as that due to concentration difference.

Figure 6C:
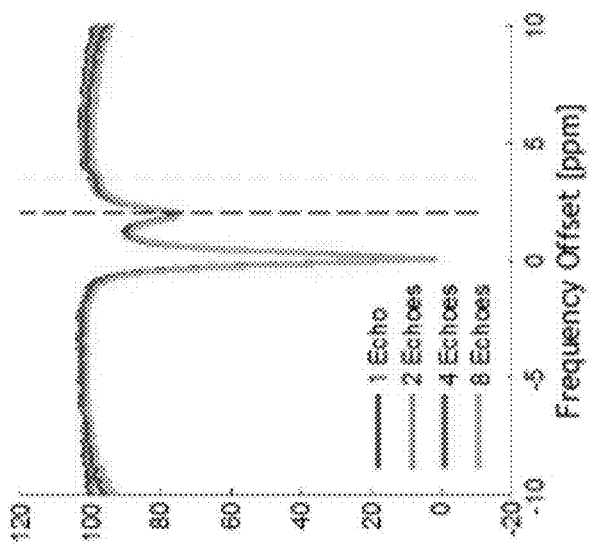
FIG. 6c illustrates normalized Z spectra calculated as $I/I_0$ using a multi-echo acquisition sequence with different numbers of signal averages.
Figure 6B:
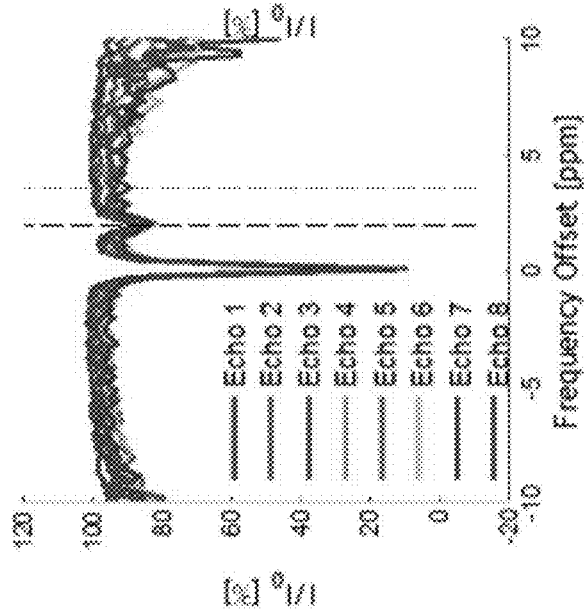
FIG. 6b illustrates reference spectrum ($I_0$) and Z spectra (I) at different saturation levels using a multi-echo acquisition sequence.
Figure 6A:
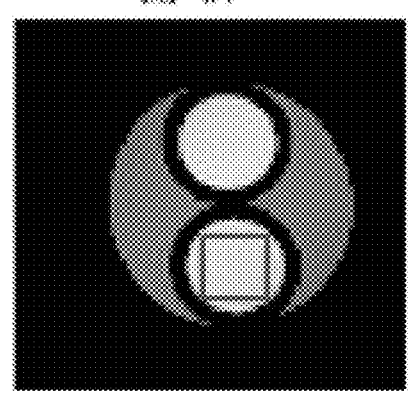
FIG. 6a is a phantom image that includes a single voxel in the left phantom.

FIG. 6a-6c illustrate images using single-voxel multi-echo fast CEST Z-spectral imaging. 8 echoes were acquired and the SNR of Z-spectrum may be improved by averaging first 1, 2, 4 or 8 echo signals. FIG. 6a is a phantom image that includes a single voxel in the left phantom. FIG. 6b illustrates reference spectrum and Z spectra at different saturation levels using a multi-echo acquisition sequence. FIG. 6c illustrates normalized Z spectrum using a multi-echo acquisition sequence with different numbers of signal averages.

Figures 7A, 7B, 7C:
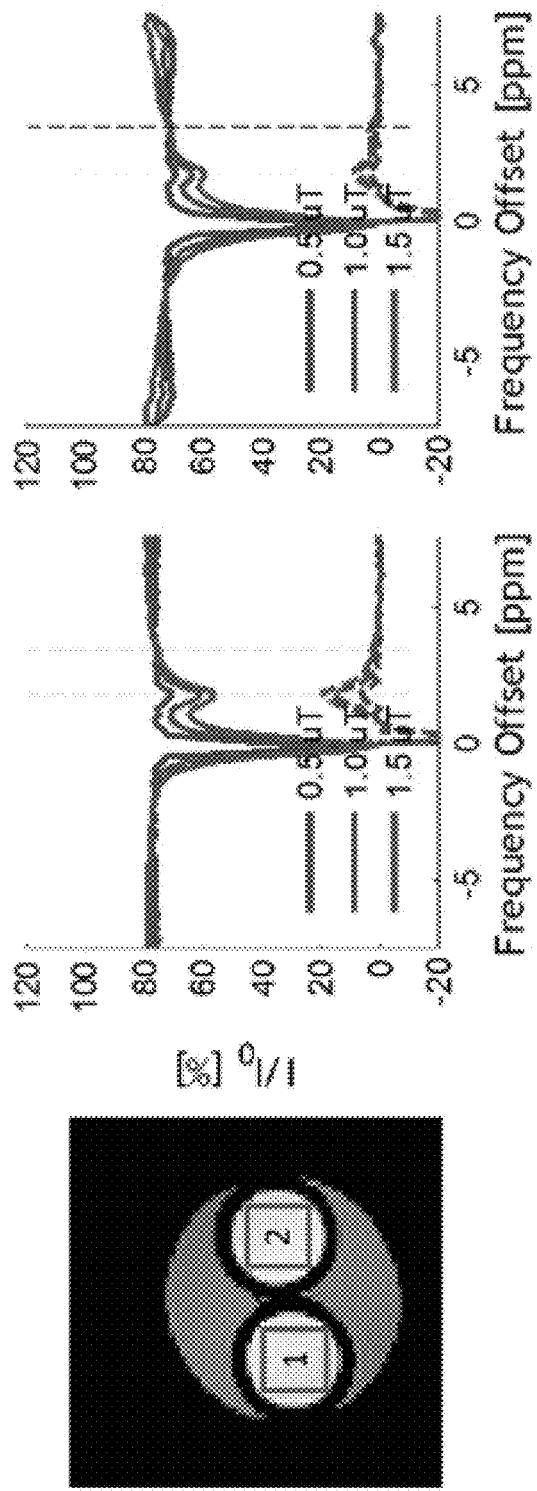
FIG. 7a is a phantom image that includes two voxels of interest in two phantoms.
FIG. 7b illustrates Z spectra at different saturation levels corresponding to the voxel illustrated in the left phantom using a multi-voxel acquisition sequence.
FIG. 7c illustrates Z spectra at different saturation levels corresponding to the voxel illustrated in the right phantom using a multi-voxel acquisition sequence.

FIG. 7a-7c illustrate images using multi-voxel fast CEST Z-spectral imaging. Here, FIG. 7a is a phantom image that includes two voxels from a multi-compartment phantom. FIG. 7b illustrates Z spectrum of the voxel in the left ROI using a multi-echo acquisition sequence. FIG. 7c illustrates Z spectrum of the voxel in the right ROI using a multi-echo acquisition sequence.

Figure 8:
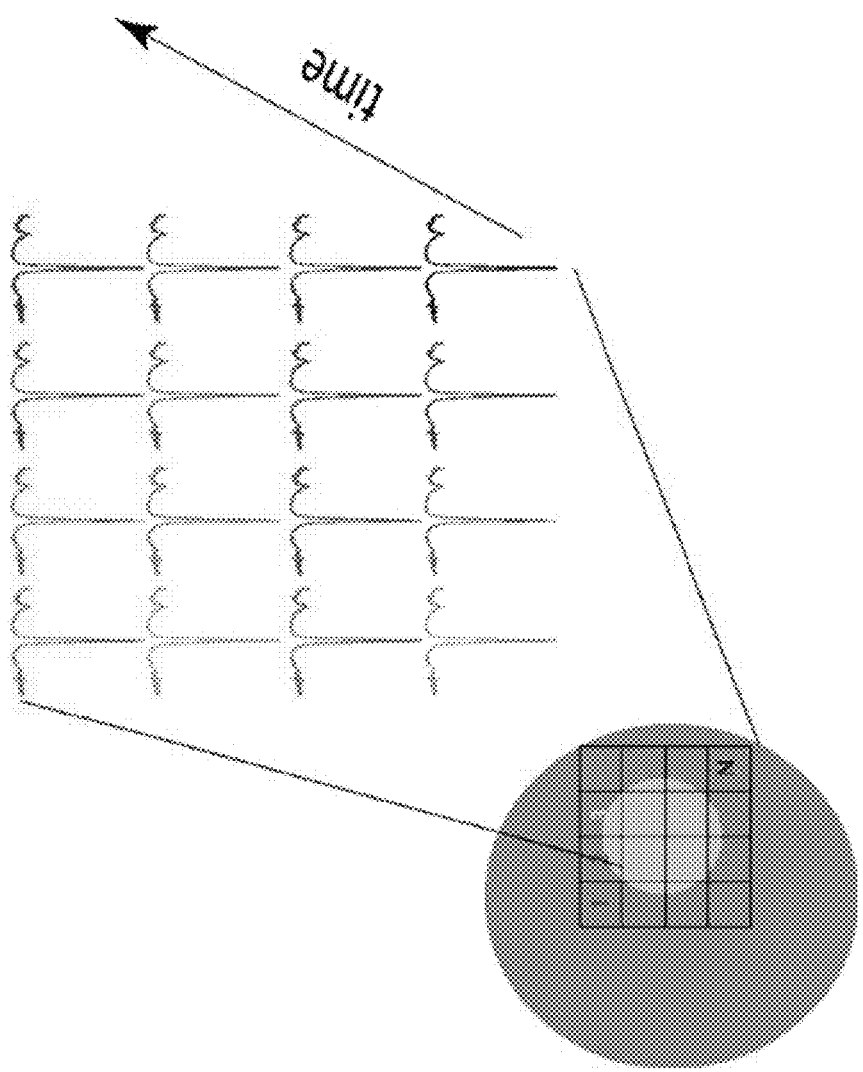
FIG. 8 illustrates the concept of a fast in vivo dynamic SCSI.

The disclosed SCSI sequence in FIG. 4 allows the MRI system to map CEST Z-spectra from the region of interest with reasonable spatial resolution quickly, which is desirable for dynamic imaging especially in vivo study (FIG. 8). FIG. 8 illustrates a fast in vivo dynamic SCSI.

Figure 9C:
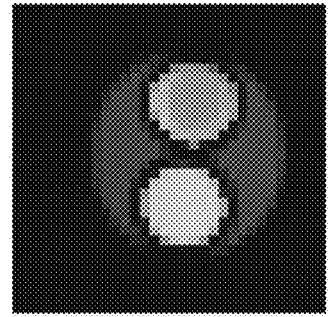
FIG. 9c is an image illustrating a Nicotinamide concentration map reconstructed from SCSI data acquired using techniques of the present disclosure.
Figure 9B:
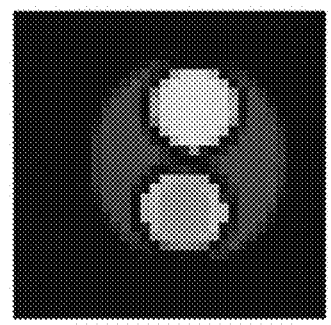
FIG. 9b is an image illustrating a Creatine concentration map reconstructed from SCSI data acquired using techniques of the present disclosure.
Figure 9A:
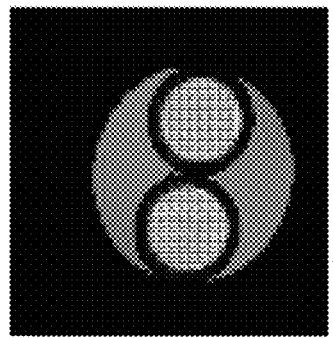
FIG. 9a is an image illustrating SCSI Z-spectra from each voxel overlaid to T2 weighted image.
Figure 9D:
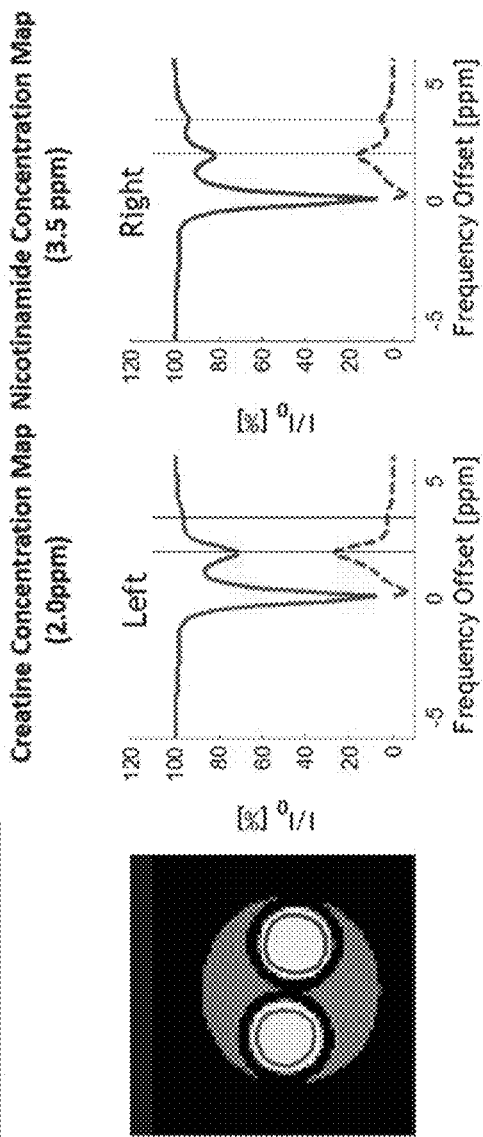
FIG. 9d is a phantom image that includes two regions of interest (ROIs) in the left and right phantom, respectively.
Figure 9D:
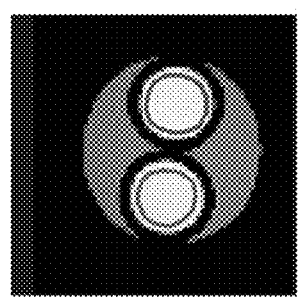

The SCSI sequence is demonstrated in vitro first using the same creatine/nicotinamide CEST phantom. The repetition time (TR) is 5 s and the saturation time (TS) is 2.5 s with NSA=2. The matrix size is 8 by 8 and reconstructed to 32 by 32. The proposed SCSI can capture creatine and nicotinamide concentration differences (50 mM vs. 100 mM vs. background, FIG. 9a-9f). FIG. 9a is an image illustrating SCSI Z-spectra from each voxel overlaid to T2 weighted image. FIG. 9b is an image illustrating a Creatine concentration map reconstructed from SCSI data acquired using techniques of the present disclosure. FIG. 9c is an image illustrating a Nicotinamide concentration map reconstructed from SCSI data acquired using techniques of the present disclosure. FIG. 9d is a phantom image that includes two regions of interest (ROIs) in the left and right phantom, respectively. FIG. 9e illustrates normalized z spectrum from the ROI in the left phantom along with the asymmetric magnetization transfer ratio, where the two vertical lines indicate the peak locations of Creatine at 2 ppm and Nicotinamide at 3.5 ppm. FIG. 9f illustrates normalized z spectrum from the ROI in the right phantom along with the asymmetric magnetization transfer ratio, where the two vertical lines indicate the peak locations of Creatine at 2 ppm and Nicotinamide at 3.5 ppm.

Conventional CSI showed much lower sensitivity as it is highly dependent on the performance of water suppression (data not shown). In practice, the residual water peak in conventional CSI is distorted and varies spatially in amplitude, which leads to substantial baseline variability that impairs metabolite quantification. This can be overcome by the SCSI approach as it exploits CEST contrast to investigate the interaction between metabolites/contrast agents and tissue water so no water suppression is required.

The sequence was designed to be flexible so multi-echo acquisition can be used to improve the SNR like in meCEST MRI and voxel-based fast Z-spectral imaging (FIG. 10a-10d and FIG. 11). Note gradient G3 is applied during the data acquisition. If multi-gradient echoes, or a combined spin echo and gradient echoes are acquired, the intensity or polarity of G3 need to be adjusted to properly form the signal, as the standard EPI or Gradient And Spin Echo (GRASE). Furthermore, the SCSI acquisition can be accelerated by utilizing multiple 180° RF pulses to create many echoes, which can be similar to RApid Imaging with Refocused Echoes (RARE) technique. By applying a different phase encoding gradient to each echo multiple k-space lines can be collected in one go. The speed up factor compared to a conventional spin-echo sequence is therefore equal to the number of refocusing pulses applied (i.e. using 4 refocusing pulses would result in a ×4 speed up). Alternatively, a hybrid technique named Gradient And Spin Echo (GRASE) can be exploited to gain SNR from significant residual MR signals after the first echo acquisition and/or accelerate the data acquisition. GRASE generates a series of spin echoes from a train of 180° RF pulses like the RARE approach and three or more gradient refocused echoes centered about (and overlapping) each spin echo are also produced by rapidly switching the readout gradient polarity between each 180° RF.

Figure 10A:
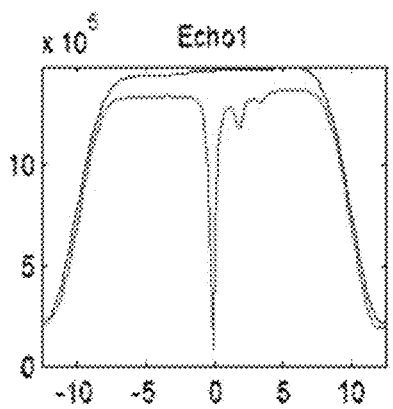
FIG. 10a illustrate reference spectrum and Z spectrum according to the first echo from a multi-echo SCSI data acquired using techniques of the present disclosure.
Figure 10B:
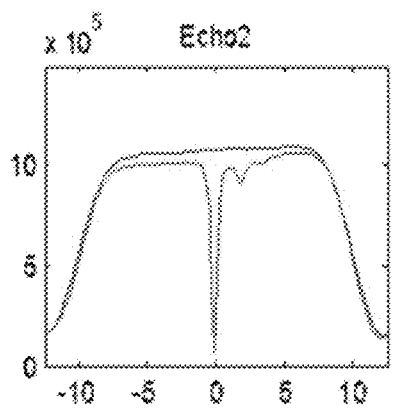
FIG. 10b illustrate reference spectrum and Z spectrum according to the second echo from a multi-echo SCSI data acquired using techniques of the present disclosure.
Figure 10C:
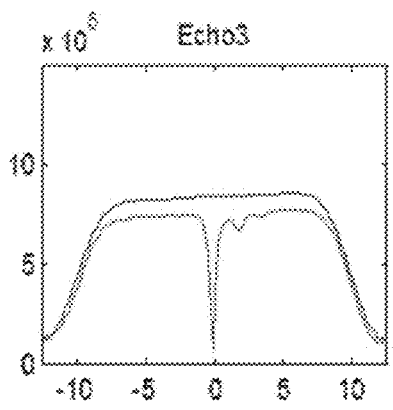
FIG. 10c illustrate reference spectrum and Z spectrum according to the third echo from a multi-echo SCSI data acquired using techniques of the present disclosure.
Figure 10D:
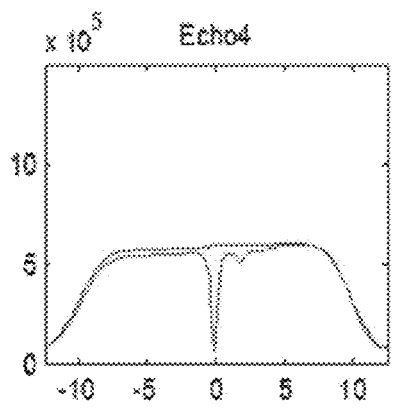
FIG. 10d illustrate reference spectrum and Z spectrum according to the fourth echo from a multi-echo SCSI data acquired using techniques of the present disclosure.

FIG. 10a illustrate reference spectrum and Z spectrum according to the first echo from a multi-echo SCSI data acquired using techniques of the present disclosure. FIG. 10b illustrate reference spectrum and Z spectrum according to the second echo from a multi-echo SCSI data acquired using techniques of the present disclosure. FIG. 10c illustrate reference spectrum and Z spectrum according to the third echo from a multi-echo SCSI data acquired using techniques of the present disclosure. FIG. 10d illustrate reference spectrum and Z spectrum according to the fourth echo from a multi-echo SCSI data acquired using techniques of the present disclosure.

Figure 11:
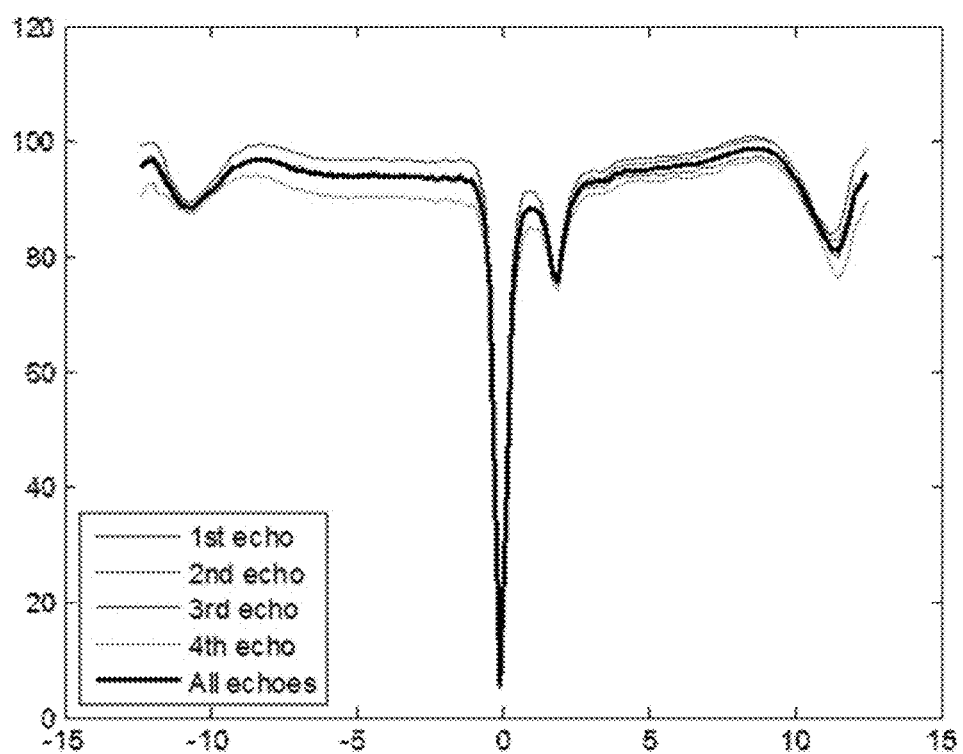
FIG. 11 illustrates normalized Z spectra using data from each echo and from all echoes.

FIG. 11 illustrates Z spectrum using data from one of the echoes and from all echoes. The Z spectrum using all echoes has an improved SNR. Additionally or alternatively, SCSI with multi-echo acquisition can be used for spatial encoding to further reduce the scan time.

Furthermore, in vivo SCSI was performed on the kidneys of eight adult Wistar rats with respiratory triggering after a CT contrast agent Iopamidol (Isovue370, 1.5 mg I/g) injection. The parameters of in vivo SCSI was similar to in vitro study except for TR is 6 s and TS is 3 s, FOV is 22×16 mm$^2$, slab thickness is 4 mm and 128 spectral points from −2 to 8 ppm. Note that the range of frequency offset does not have to be symmetric but can be arbitrary like in this case. Renal pH-weighted map was calculated using ratiometric analysis by taking the amplitude ratio of 5.5 and 4.3 ppm. FIG. 12a-12c show renal ratiometric CEST map obtained with SCSI, which is considered pH sensitive, clearly resolved the relative pH differences among cortex, medulla and calyx.

Specifically, FIG. 12a shows in vivo renal image including SCSI Z-spectra from a SCSI data from a representative animal after iopamidol injection. FIG. 12b shows CEST maps at 4.3 ppm and 5.5 ppm and corresponding pH-weighted map calculated from ratiometric analysis by taking the amplitude ratio of 5.5 and 4.3 ppm. FIG. 12c shows Z-spectrum ratio ($I/I_0$) from cortex (blue), medulla (green) and calyx (red) from a representative animal after iopamidol injection.

The above-described systems and method provide a synergistic combination of fast Z-spectroscopy and spatial encoding that advantageously provides CEST frequency offsets encoded by gradient (G1) during saturation RF pulse, ROI selection, and phase/phase or phase/frequency encoded spatial resolution. Each phase encoding step can be used to measure the spectrum. Thus, while conventional CSI measures diluted metabolites, SCSI exploits the CEST mechanism to investigate the interaction between metabolites/contrast agents and tissue water to provide sensitivity-enhanced characterizations of metabolites and pH, and the like.

The foregoing demonstrated that CEST images can be derived using SCSI in accordance with the present disclosure. In summary, the SCSI MRI technique of the present disclosure provides a novel and superfast acquisition strategy for CEST imaging. The SCSI method integrates spatial encoding with more sensitive fast CEST measurement, enabling superfast Z-spectral imaging with good spatiotemporal resolution. The images demonstrate the feasibility of the SCSI in vitro and in vivo, showing enhanced sensitivity of measurements of metabolites and pH information. The proposed SCSI technique is desirable for monitoring dynamic processes, rapid quantification of chemical exchange rates of CEST agents, and fast tissue characterization. Further, the SCSI technique captures Z-spectra that allows the MRI system to distinguish potential overlapping metabolites using line decoupling. This approach may be extended with multiple volume selection. Additionally, the system further performs spatial encoding with phase and/or frequency encoding gradients.

The present disclosure has been described in terms of one or more embodiments, and it should be appreciated that many equivalents, alternatives, variations, and modifications, aside from those expressly stated, are possible and within the scope of the disclosure. For example, it is contemplated that the above-described techniques may be used to perform multi-echo CEST-spectroscopy. The process for multi-echo CEST-spectroscopy is based on the same principles described above.

We claim:

1. A magnetic resonance imaging (MRI) system comprising:
   a magnet system configured to generate a polarizing magnetic field about at least a region of interest (ROI) in a subject arranged in the MRI system;
   a plurality of gradient coils configured to apply a gradient field to the polarizing magnetic field;
   a radio frequency (RF) system configured to apply an excitation field to the subject and acquire MR image data from the ROI;
   a computer system programmed to:
      control the RF system to apply a saturation radiofrequency (RF) irradiation during a saturation time period at a reference frequency that saturates a selected labile spin species of the subject;
      control the plurality of gradient coils to encode frequency offsets by applying a gradient G1, along slice selection or a preset direction, at least during the saturation time period;
      control the plurality of gradient coils to apply a plurality of slice selection gradients accompanied by a train of RF pulses during a voxel selection time period, wherein a padding gradient G2 is applied to control a signal formation;
      control the plurality of gradient coils to apply a third gradient G3 during an acquisition time period;
      control the RF system and the plurality of gradient coils, during the acquisition time period, to acquire one or more spin echo signals having spatial and spectral information pertaining to at least one of metabolites and metabolite byproducts within the ROI to form a chemical exchange saturation transfer (CEST) medical imaging data set during the acquisition time period; and
      reconstruct the CEST medical imaging data set to form a CEST image of the subject including information about the at least one of metabolites and metabolite byproducts within the subject.

2. The MRI system of claim 1 wherein the computer system is programmed to apply an RF pulse with a flip angle of 180° and readout gradient before the acquisition time period.

3. The MRI system of claim 2 wherein the computer system is programmed to select one or more voxels by applying the plurality of slice selection gradients accompanied by a train of RF pulses during a voxel selection time period.

4. The MRI system of claim 3 wherein the computer system is further configured to calculate magnitude and polarity of the padding gradient G2 based on the signal formation during G3.

5. The MRI system of claim 4 wherein the computer system is further configured to acquire the one or more spin echo signals when applying the third gradient G3 during the acquisition time period.

6. The MRI system of claim 1 wherein the computer system is further programmed to select the one or more voxels by applying a Point-RESolved Spectroscopy (PRESS) pulse sequence.

7. The MRI system of claim 6 wherein the computer system is further programmed to select the one or more voxels by applying a STimulated Echo Acquisition Mode (STEAM) pulse sequence.

8. The MRI system of claim 1 wherein the computer system is further programmed to reconstruct a plurality of images from the CEST medical imaging data set, wherein each of the plurality of images corresponds to one of the one or more spin echo signals.

9. The MRI system of claim 1, wherein the computer system is programmed to acquire the one or more spin echo signals with a repetition time chosen based on properties of an underlying CEST system of interest; and
   wherein the computer system is programmed to choose the saturation time period based on properties of the underlying CEST system of interest.

10. The MRI system of claim 1 wherein the computer system is further programmed to perform spatial encoding with at least one of phase and frequency encoding.

11. The MRI system of claim 1 wherein the ROI comprises one of the following: brain, breast, prostate, muscle, liver, kidney, placenta, and heart.

12. A method for producing an image of a subject with a magnetic resonance imaging (MRI) system, the method comprising:
    applying, with the MRI system, a saturation radiofrequency (RF) irradiation during a saturation time period at a reference frequency that saturates a selected labile spin species of a subject;
    encoding, with the MRI system, frequency offsets by applying a gradient G1, along a slice selection direction or a preset direction, at least during the saturation time period;
    applying a plurality of slice selection gradients accompanied by a train of RF pulses during a voxel selection time period, wherein a padding gradient G2 is applied for formation of a spin echo;
    applying a third gradient G3 during an acquisition time period;
    acquiring, with the MRI system, one or more spin echo signals having information pertaining to at least one of metabolites and metabolite byproducts within a region of interest (ROI) to form a chemical exchange saturation transfer (CEST) medical imaging data set during the acquisition time period; and
    reconstructing, with the MRI system, the CEST medical imaging data set to form a CEST image of the subject including information about the at least one of metabolites and metabolite byproducts within the subject.

13. The method of claim 12 further comprising at least one of:
    calculating a quantitative CEST map using ratiometric analysis by taking amplitude ration at different frequency offsets; and
    performing line decoupling to derive CEST effect from one or more compounds.

14. The method of claim 12 further comprising selecting one or more voxels by applying a plurality of slice selection gradients accompanied by a train of RF pulses during the voxel selection time period.

15. The method of claim 12 further comprising applying the plurality of slice selection gradients accompanied by the train of RF pulses during the voxel selection time period, wherein a magnitude and polarity of the padding gradient G2 is calculated based on a signal formation during G3.

16. The method of claim 12 further comprising acquiring the one or more spin echo signals when applying the third gradient G3 during the acquisition time period.

17. The method of claim 12 further comprising choosing the saturation time period based on properties of an underlying CEST system of interest.

18. The method of claim 12 further comprising acquiring the one or more spin echo signals with a repetition time that is chosen based on properties of an underlying CEST system of interest.

19. A method for producing a report regarding a subject with a magnetic resonance imaging (MRI) system, the method comprising:

applying, with the MRI system, a saturation radiofrequency (RF) irradiation during a saturation time period at a reference frequency that saturates a selected labile spin species of a subject;

encoding, with the MRI system, frequency offsets by applying a gradient G1 at least during the saturation time period;

applying a plurality of slice selection gradients accompanied by a train of RF pulses during a voxel selection time period;

applying a padding gradient G2 for formation of spin echo;

acquiring, with the MRI system, one or more spin echo signals having information pertaining to at least one of metabolites and metabolite byproducts within a region of interest (ROI) to form a chemical exchange saturation transfer (CEST) data set with spatial encoding; and generating a spectroscopy report from the CEST data set including information about the at least one of metabolites and metabolite byproducts within the subject.

20. The method of claim 19 further comprising:

applying a gradient G3 during an acquisition time period.

* * * * *